United States Patent
Ranjbar et al.

(10) Patent No.: US 9,548,754 B1
(45) Date of Patent: *Jan. 17, 2017

(54) SYSTEMS AND METHODS FOR COMPARATOR CALIBRATION

(71) Applicant: INPHI CORPORATION, Santa Clara, CA (US)

(72) Inventors: Mohammad Ranjbar, Santa Clara, CA (US); Jorge Pernillo, Daly City, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/146,214

(22) Filed: May 4, 2016

Related U.S. Application Data

(63) Continuation of application No. 14/935,306, filed on Nov. 6, 2015, now Pat. No. 9,356,615.

(51) Int. Cl.
  *H03M 1/10* (2006.01)
  *H03M 1/68* (2006.01)
  *H03M 1/38* (2006.01)

(52) U.S. Cl.
  CPC ............ *H03M 1/1028* (2013.01); *H03M 1/38* (2013.01); *H03M 1/68* (2013.01)

(58) Field of Classification Search
  CPC ......... H03M 1/1028; H03M 1/38; H03M 1/68
  USPC .................. 341/120, 155, 161–164
  See application file for complete search history.

(56) References Cited

U.S. PATENT DOCUMENTS

| | | | | |
|---|---|---|---|---|
| 8,081,097 B2 * | 12/2011 | Hsu | ..................... | H03M 1/1042 341/120 |
| 8,446,304 B2 * | 5/2013 | Scanlan | .............. | H03M 1/1004 341/120 |
| 8,766,833 B1 * | 7/2014 | Bogner | ............... | H03M 1/1014 341/118 |
| 8,907,834 B2 * | 12/2014 | Lee | ..................... | H03M 1/1009 341/120 |
| 8,957,794 B2 * | 2/2015 | Verbruggen | ........ | H03M 1/1023 341/118 |

* cited by examiner

*Primary Examiner* — Khai M Nguyen
(74) *Attorney, Agent, or Firm* — Richard T. Ogawa; Ogawa P.C.

(57) ABSTRACT

The present invention is directed integrated circuits and methods thereof. More specifically, an embodiment of the present invention provides a comparator calibration loop where a digital integrator stores a running sum based on the output of a comparator. A DAC converts the running sum and generates an offset calibration voltage, which is filtered by a low-pass filter module, and the filtered offset calibration voltage is used to cancel out the intrinsic offset voltage and low frequency noise of the comparator. There are other embodiments as well.

18 Claims, 6 Drawing Sheets

# SYSTEMS AND METHODS FOR COMPARATOR CALIBRATION

CROSS-REFERENCES TO RELATED APPLICATIONS

The present application is a continuation of and claims priority to U.S. patent application Ser. No. 14/935,306 filed Nov. 6, 2015, which is hereby incorporated by reference.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to integrated circuits and methods thereof.

In data communication systems, analog and digital signals are both used. Typically, digitized signals are transferred as analog signals through communication medium (e.g., modulated electrical signal through copper wires, modulated optical signal through optical links, etc.). As a part of communication process, signals are converted between digital and analog forms. Comparators are an important aspect of signal processing and performing analog to digital conversion. For example, to perform analog-to-digital conversion (ADC), comparators are important part of the conversion process. In a direct-conversion ADC process, a bank of comparators is used to sample the input signal in parallel. A successive-approximation ADC uses a comparator to successively narrow a range that contains the input voltage. In both implementations, the accuracy of comparators is important, as it directly contributes to the accuracy of the ADCs. To keep comparators accurate, it is needed to calibrate the comparators.

There have been various solutions and techniques for calibrating comparators. Unfortunately, these solutions and techniques have been inadequate for the reasons below. Therefore, new and improved systems and methods for comparator calibration are desired.

BRIEF SUMMARY OF THE INVENTION

The present invention is directed to integrated circuits and methods thereof. More specifically, an embodiment of the present invention provides a comparator calibration loop, where an up/down counter used as a digital integrator, stores a running sum based on the output of a comparator. A Digital-to-Analog Converter (DAC) converts the running sum and generates an offset calibration voltage, which is filtered by a low-pass filter module, and the filtered offset calibration voltage is used to null-out the offset and low-frequency noise of the comparator. There are other embodiments as well.

According to an embodiment, the present invention provides a system for providing comparator calibration. The system includes a voltage input. The system additionally includes a low pass filter module electrically coupled to the voltage input. The low pass filter module includes a first capacitor and a second capacitor. The first capacitor and the second capacitor are configured in parallel. The first capacitor is characterized by a first capacitance value and the second capacitor being characterized by a second capacitance value. The first capacitance value is greater than the second capacitance value. The low pass filter is configured to provide an output voltage based at least on a first voltage of the first capacitor. The system additionally includes a first calibration switch provided between the first capacitor and the second capacitor. The system also includes a comparator electrically coupled to the low pass filter module and configured to generate a modification value. The modification value is positive if the output voltage is greater than 0, and the modification value is negative if the output voltage is 0 or less. The system additionally includes an up/down counter used as a digital integrator, electrically coupled to the comparator and storing an m-bit digital value. The m-bit code is incremented or decremented based on the modification value. The system also includes a DAC electrically coupled to an up/down counter or a digital integrator. The DAC is configured to convert n-MSBs of the m-bit value to a feedback voltage, n being less than or equal m. The system further includes a second calibration switch provided between the second capacitor and the DAC.

According to another embodiment, the present invention provides a system for providing comparator calibration, which includes a voltage input. The system also includes a comparator electrically coupled to a low pass filter module and configured to generate a modification value. The modification value is positive if an output voltage is greater than 0, and the modification value is negative if the output voltage is 0 or less. The system additionally includes an up/down counter used as a digital integrator, electrically coupled to the comparator and storing an m-bit digital value. The m-bit value is incremented or decremented using the modification value. The system further includes a DAC electrically coupled to the counter. The DAC is configured to convert the n MSBs of the m-bit value to a feedback voltage, where n is less than or equal m. The system also includes a low-pass filter module configured to filter the feedback voltage to generate the output voltage. The low-pass filter module includes at least a first capacitor and a second capacitor. The first capacitor and the ratio between the first and the second capacitor is configured for removing the noise associated with the feedback voltage within a noise frequency range characterized by the update rate of the calibration loop and the ratio between the first capacitor and the second capacitor.

According to yet another embodiment, the present invention provides a system for providing comparator calibration. The system includes a first comparator feedback loop, which includes a first comparator, a first up/down counter used as a digital integrator, a DAC, and a first low-pass filter. The system also includes a second comparator feedback loop, which includes a second comparator, a second counter, the DAC, and a second low-pass filter. During a first time period, the first comparator generates a first modification value, the first counter generates a first calibration value, the DAC generates a first calibration voltage, and the first low-pass filter filters the first calibration voltage. During the second time period, the first comparator calibrates using the filtered first calibration voltage, the second comparator generates a second modification value, the second counter generates a second calibration value, the DAC generates a second calibration voltage, and the second low-pass filter filters the second calibration voltage.

It is to be appreciated that the embodiments of the present invention provide many advantages over conventional techniques. Among other features, by eliminating the need for a high gain pre-amplifier, typically implemented by cascading multiple low gain amplifiers in conventional techniques, the total size and power consumption of components involved in calibrating a comparator is substantially reduced. More specifically, a comparator calibration loop according to the embodiments of the present invention can be implemented using a counter, a coarse DAC, and a low-pass filter module, and the total size and power consumption of these components is less than the size and power consumption of a high gain amplifier used in conventional comparator calibration mechanisms. The size and area savings are multiplied when a single DAC is shared, by time-interleaving, among multiple comparator calibration loops. In addition, the comparator calibration process is performed outside the critical signal path of the comparator, thereby reducing the likelihood of causing noise or interference or slow down of the main signal path, which is crucial in high-speed applications. The comparator calibration systems and methods thereof are compatible with existing systems and techniques, and can thus be readily integrated into existing and future comparator designs. In addition to reducing the amount of hardware components as explained above, various parameters for providing offset cancellation can be conveniently adjusted. For example, the range of correctable offset can be adjusted by simply changing the reference voltage of the DAC. Similarly, total noise, residual offset, and the number of cycles for convergence are characteristics that can be adjusted by changing one or more parameters. For example, to adjust these performance characteristics, counter number of bits m, DAC resolution n, absolute value of the two capacitors, the ratio between the two capacitors, and the update rate of the calibration loop, can be easily modified to suit a specific application. There are many other benefits as well.

DETAILED DESCRIPTION OF THE INVENTION

The present invention is directed to integrated circuits and methods thereof. More specifically, an embodiment of the present invention provides a comparator calibration loop where an up/down counter used as a digital integrator, stores a running sum based on the output of a comparator. A DAC converts the running sum and generates a calibration voltage, which is filtered by a low-pass filter module, and the filtered calibration voltage is used to counter the input offset and low-frequency noise of the comparator. There are other embodiments as well.

Figure 1:
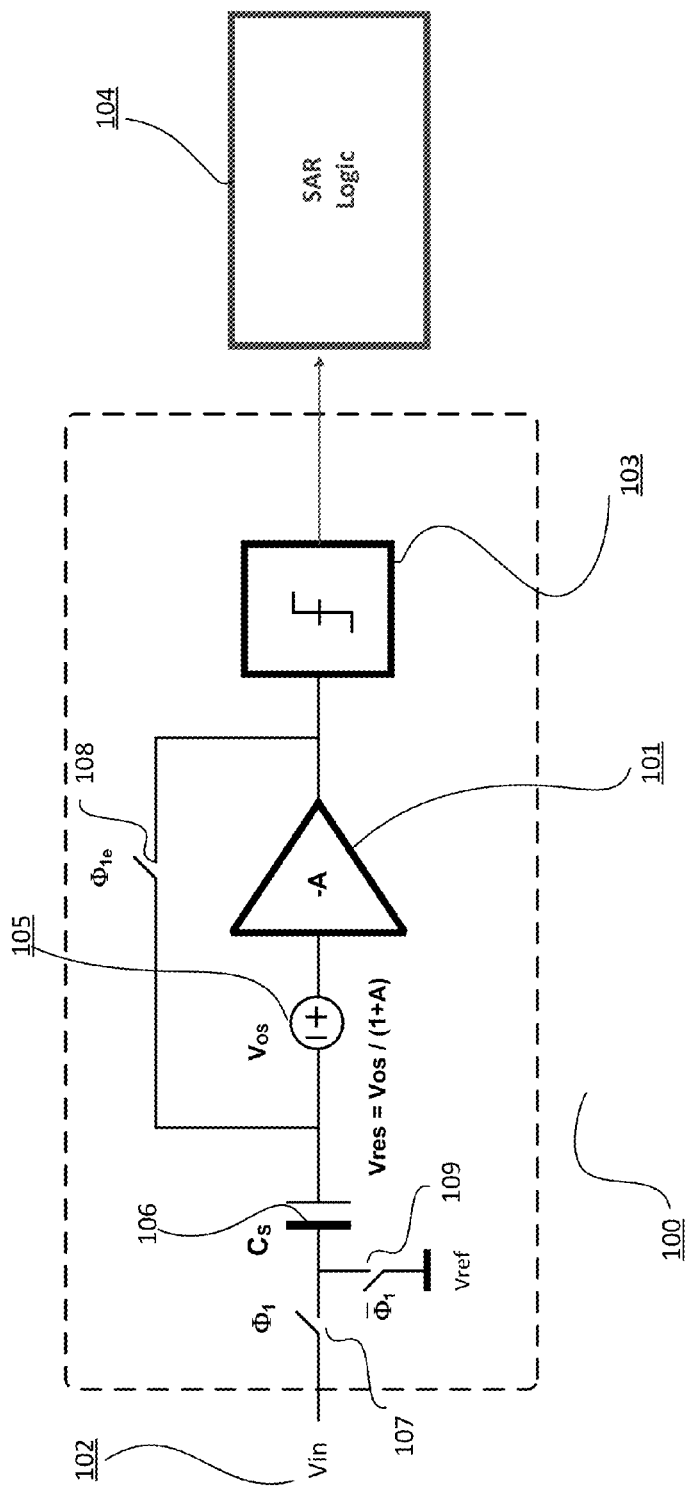
FIG. 1 is a simplified diagram illustrating a conventional comparator system 100.

As explained above, conventional comparator offset calibration methods depend on pre-amplifiers with high DC gain which makes them inadequate for integrated circuits implemented in modern process technologies with declining inherent DC gains. For a comparator to function properly, it is often necessary to calibrate the comparator, so that the comparator has an accurate reference value to compare to. To achieve calibration, a comparator typically includes an auto-zero function. For example, FIG. 1 is a simplified diagram illustrating a conventional comparator system 100. For illustration purposes, the comparator use cases throughout this disclosure are shown along with a successive-approximation-register (SAR) ADC and are merely used as an example. Comparators can be used with other ADC architectures or other general applications where analog comparison is required. The comparator system 100 receives analog input voltage from Vin 102, which is to be compared against a reference voltage Vref 108 by the comparator 103. For illustration purposes the comparator output 103 is connected to a successive-approximation-register (SAR) logic 104, which is used to perform analog to digital conversation (ADC) operation. While comparator 103, implemented in conjunction with other components, is shown in FIG. 1 to be used for ADC operations, it is to be understood that the comparator 103 can be used for other functionalities as well.

The comparator system 100 has an "auto-zero" function, which refers to its ability to null-out (or "zero") the net errors of the comparator 103 at its input. Among other things, the "auto zero" function is an important aspect of the comparator system; the offset is to be calibrated in order for the comparator to work accurately. For example, the input-referred offset (Vos) of an auto-zero system (i.e. input series cancellation) is Vos/(1+A). It is to be understood that Vos is a property of the amplifier 101. The system 100 operates in an auto-zero phase and a comparison phase. During the auto-zero phase the input voltage to the comparator 102 gets sampled over the bottom plate of the sampling capacitor 106 by switch 107 whilst an estimate of the un-calibrated comparator offset 105 gets sampled over the top plate of the sampling capacitor by switch 108. During the "auto-zero" phase, the voltage across the sampling capacitor due to the un-calibrated comparator offset Vos can be described as $$V\text{cap}=-Vos*A/(1+A) \quad \text{Equation 1:}$$

This is merely an estimate of the actual Vos where the accuracy of the estimate improves only by increasing the gain value A.

During the "comparison" phase when the switch 109 is closed the voltage at the output of the amplifier 101 can be described as $$V\text{out}=A[(V\text{in}-V\text{ref})-Vos/(1+A)] \quad \text{Equation 2:}$$

According to the above the ideal portion of the comparator operation is represented by the difference voltage (Vin−Vref) and the non-ideal portion is represented by a residual offset Vres=Vos/(1+A) which is an attenuated version of the original input referred offset Vos 105. For the scheme illustrated in FIG. 1, the residual offset "Vres" is a function of the amplifier gain "A" and the Vos. An important objective is to minimize the residual offset Vres, and based on Equation 2, a larger amplifier gain ("A") translates to smaller residual input-referred offset. Thus, for the error term "Vres" to be small, the amplification of the amplifier 101 needs to be high.

In electrical circuits utilizing discrete components, or in integrated circuits implemented in older process nodes with large device gains, providing amplification is relatively simple by utilizing a high-gain amplifier. However, providing a high gain amplifier is challenging in integrated circuits (IC) that are manufactured in the nanometer scale. For example, leading microprocessors are now manufactured using 14 nm and 20 nm processes, and IC components such as CMOS logic often manufactured using processes that are 40 nm or less. Using these nanometer scale processes, implementing high gain amplifier typically requires cascading many amplifiers to achieve the required amplification. Unfortunately, there are a few disadvantages associated with having high gain amplifiers. High gain amplifiers, in IC design, typically needs to be implemented using multi-stage or "cascaded" amplifiers. The arrangement of cascading multiple low-gain amplifiers is merely intended to achieve high overall gain without significant slowdown of the signal path, which could be the case with a single-stage high-gain amplifier. Nonetheless, this practice leads to increased overall power consumption and chip area. Moreover, using multiple amplifiers means introducing additional delays and timing issues. It is worth mentioning the single-stage high-gain amplifiers are typically characterized by their high output impedance, which in combination with the load capacitance creates a large time-constant, directly translating to lower speeds. As a result, implementing a high gain amplifier or the equivalent thereof is expensive and sometimes impractical (e.g. speed penalty unacceptable or large chip area unavailable for the multi-stage high gain amplifier). In addition, with the amplifier 101 positioned in the critical path of the comparator system 100, there could be signal degradation.

It is thus to be appreciated that embodiments of the present invention provide a calibration scheme for comparators. More specifically, by using digital integrator and digital-analog-converter (DAC), among other components, embodiments of the present invention provide a calibration scheme that allows calibration to be carried out outside the critical signal path of the comparator and does not require a high-gain amplifier. The details of the comparator calibration systems according to embodiments of the present invention are provided below.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 2:
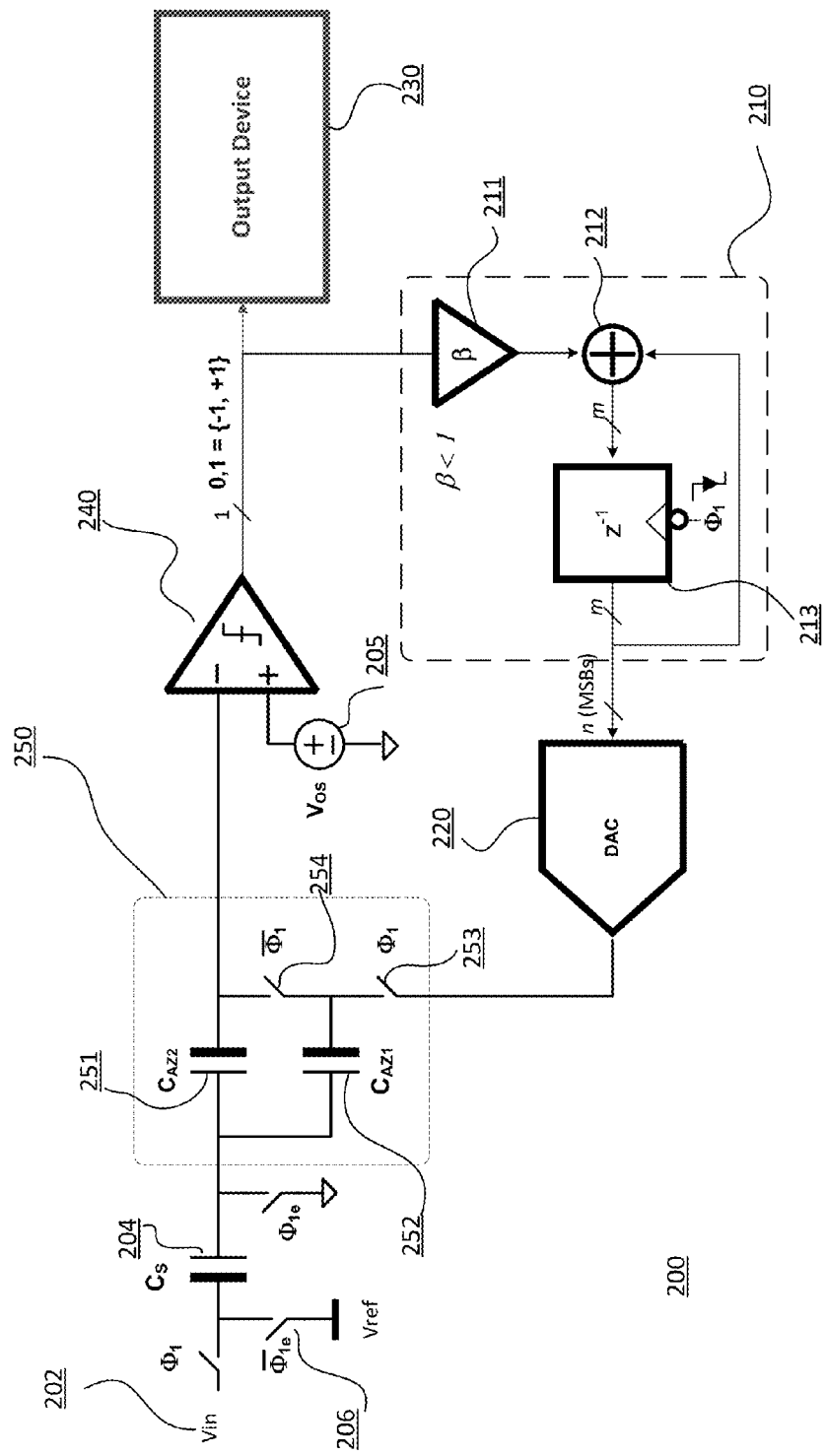
FIG. 2 is a simplified diagram illustrating a comparator system according to an embodiment of the present invention.

FIG. 2 is a simplified diagram illustrating a comparator system according to an embodiment of the present invention. This diagram is merely an example, which should not unduly limit the scope of the claims. One of ordinary skill in the art would recognize many variations, alternatives, and modifications. A comparator system 200 receives an input at Vin 202. For example, the input received at the Vin 202 is an analog waveform, which is to be converted to a digital signal. The comparator system 200 includes a low-pass filter module 250. The low-pass filter module 250 includes capacitor 251 and capacitor 252. The capacitor 252, as a part of the calibration process, holds calibration offset value needed for the system. In various implementations, the capacitance $C_{AZ2}$ of the capacitor 251 is much greater than capacitance $C_{AZ1}$ of the capacitor 252. For example, in certain implementations, $C_{AZ2}$ can be 100 times larger than $C_{AZ1}$. Additionally, the low-pass filter module 250 includes switch 253 and switch 254. Operating the switch 253 determines whether the calibration value from the DAC is to be loaded to the capacitor 252. For example, the calibration value from the DAC is effectively the calibration voltage that can be later used to calibrate the comparator module. Operating the switch 254 determines whether the calibration voltage of the capacitor 252 is used to calibrate the comparator 240. If the calibration voltage is to be used, the calibration is performed with Vos 205. As an example, Vos 205 represents the equivalent input-referred offset of the comparator 240. Because DAC 220 has finite resolution, it can introduce quantization noise directly to the comparator input. The low-pass filter module 250 is configured to attenuate the errors introduced by the quantization effects at DAC 220. In other words, the low-pass filter 250 smoothes out the instantaneous jumps at DAC 220 output and gradually settles to the average value represented by the DAC output levels. More specifically, in the low-pass filter 250 the capacitor 251 holds the "auto-zero" voltage, thereby providing an offset nulling function. The size of the capacitor 251 is related to the characteristics of the DAC 220 such as resolution and update rate. In addition to providing calibration voltage at a predetermined time, It is to be appreciated that the comparator 240 and its output can be used for different applications. As shown in FIG. 2, the output of the comparator 240 is, as example, used by the processing device 230, which can be used for performing ADC operations. For example, the processing device 230 can be the control logic of a SAR ADC, encoding logic of a flash ADC, or others. Depending on the application, the comparator 240 may also be used as a part a null detector, a zero-crossing detector, a relaxation oscillator, a level shifter, or a window detector. The comparator 240 is calibrated without using a high-gain amplifier in its critical path through which it receives the input voltage. The output of the comparator 240 as shown is used by the processing device 230.

In addition to performing its function as a comparator, the comparator 240 also provides a value that is used in a calibration feedback loop comprising the digital integrator module 210, DAC 220, and low-pass filter module 250. More specifically, the digital integrator module 210 generates a digital value using the logic "0" or "1" output of the comparator 240. For example, the integrator output value stored at register 213 is a running sum based on the comparator output. The register 213 value is processed by the DAC 220 to generate the analog calibration voltage needed. The DAC 220 resolution and update rate are related to the capacitances of capacitors 251 and 252 and the ratio thereof. The calibration voltage is stored by the capacitors of the low-pass filter and used to calibrate the comparator 240.

The digital integrator module 210 is implemented with a moderate resolution (e.g., 10-bits) according to an embodiment of the present invention, and its running sum tracks and digitally quantifies the polarity and magnitude of the comparator offset. The integrator 210 input is connected to the comparator 240 output and based on the comparator decision during an "auto-zero" phase (e.g. while $\phi_1$ and $\phi_{1e}$ switches are closed), the polarity of the comparator offset is detected and its magnitude can be quantified and tracked over the long term.

More specifically, to keep the comparator calibrated, the digital integrator 210 accumulates the output values of the comparator 240. More specifically, the output of the comparator 240 is generated by comparing the equivalent input offset of the comparator represented by the voltage source Vos 205 and the voltage across capacitor 251. If the difference of Vos 205 and voltage across capacitor 251 were larger than zero, the comparator 240 outputs a value of "1", which means that the voltage across capacitor 251 at certain point needs to be increased to counter the offset voltage; on the other hand, if the difference had a negative voltage (i.e., below zero), the comparator 240 outputs a value of "−1", which means that the voltage across capacitor 251 at certain points needs to be decreased. By using the digital integrator module 210 and the DAC 220 in the calibration feedback loop, the Vos 205 offset voltage is calibrated over time. Effectively, the digital integrator 210 stores a running sum based on the Vos over time and reflecting the offset voltage over time.

It is to be appreciated that the digital integrator 210 consists of an input scaling 211 with attenuation factor of $\beta<1$, the digital summer 212 and output register 213. In the embodiment 200 shown in FIG. 2, the integrator 210, the DAC 220, the lowpass filter 250 and the comparator 240 constitute a sampled-data (discrete-time) negative feedback loop which is updated at a frequency less than or equal to the comparator clock frequency. It is also to be appreciated that the scaling factor $\beta$ can be optimized to meet stability and convergence-time requirements of the feedback loop. For example, the scale factor $\beta>1$ makes the calibration loop unstable. On the other hand if $\beta$ is chosen too small it can prolong the convergence-time of the loop.

Depending on the specific embodiment, the $\beta$ scaling factor 211 of digital integrator 210 can be implemented in various ways. A simple way of implementing an attenuation factor, with $\beta<1$, is by "shift to the right" operation. For example, scaling factor 211 as shown in FIG. 2 is merely a function block, not an actual circuit, when implemented by "shift" operation. To "shift" the integrator value, digital integrator 210 can simply send a selected number of most significant bits (MSB) to the DAC 220. For example, in an exemplary implementation, digital integrator 210 has an m-bit register, which accumulates the output of the comparator 240 and stores the result as an m-bit digital value. The output of the integrator 210 that is connected to the DAC is an n-bit value, where n is less than m, and difference between m and n is the shift factor needed for $\beta=2^{(n-m)}$, while n<m. For example, an exemplary design, based on FIG. 2, uses a 10-bit integrator (e.g. m=10) where only the 6 MSBs (e.g. n=6) are tied to the DAC. Effectively, the scaling factor $\beta$ is $2^{-4}$ (i.e., $2^{6-10}$). The truncation of the m−n LSBs effectively weights the 1-bit input to the integrator by a factor of $2^{n-m}$. In this example the n MSB bits of the integrator are updated at most once per 16 clock cycles. In other words, if the output of the comparator were kept high for 16 consecutive clock cycles, the DAC 210 would increment by 1. Depending on the specific implementation, the shift factor $\beta$ can be selected based on the desired resolution, dynamic noise performance, calibration convergence time, characteristics of various components (such as capacitor size, capacitance ratio . . . ), and/or other factors.

The integrator module 210 can be implemented by a digital accumulator or by a simple up/down counter. It is to be appreciated that the integrator 210 may be implemented in other ways as well. For example, in FIG. 3 the up/down counter 311 is used to implement the digital integrator 210 (of FIG. 2). The digital integrator 210, as shown in FIG. 2, is triggered at the falling edge of the clock, when the data value of the comparator output is expected to settle. For example, when the clock is "on" or $\Phi_1=1$, the DAC 220 generates a calibration value using the output from the integrator 210, while register 213 keeps the output value steady during this period. During the same time, the DAC 220 output is being sampled onto the low-pass filter capacitor 252 ($C_{AZ1}$). The digital integrator value is updated at the falling edge of the clock. Subsequently, when the clock is "off" or $\Phi_1=0$, the DAC 220 prepares the next analog value to be sampled over capacitor 252 ($C_{AZ1}$).

In order to speed up the convergence time of the calibration loop, the digital integrator 210, at the very start of its operation, initially stores a midpoint value. That is, when the system 200 initializes, the register 213 of integrator 210 will be reset to a midpoint value. For example, if the register 213 has a range of 0 to $2^m$, the midpoint value is $2^{m-1}$. On the other hand, when using a signed logic format, digital integrator 210 (and register 213) assumes a range of $-2^{m-1}$ to $2^{m-1}$, with the midpoint value set to 0 at the start-up.

The DAC 220 converts the calibration code received from digital integrator 210 to a calibration voltage. As explained above, the DAC 220 is an n-bits DAC and it only converts the n MSBs of the m-bit digital integrator 210. Typically, a DAC module is often an expensive component. By reducing the number of bits that DAC converts, a less expensive DAC (e.g., DAC converting fewer bits into analog signal) can be used. In addition, the DAC 220 can be shared (see FIGS. 5 and 6) among multiple comparator calibration loops. As mentioned above, the low-pass filter 250 attenuates the quantization noise of the DAC 220. According to various implementations, the DAC 220 generates a coarse analog representation, which has opposite polarity and approximately equal magnitude (with rounding off by LSBs at the integrator) to the comparator offset based on the running sum produced by digital integrator 210. One of the implementation objectives is to reduce the amount of dynamic noise created by the control loop itself, and to do so the DAC quantization needs to be maintained at a sufficiently low level (negligible compared to comparator self electronic noise).

The calibration voltage generated by the DAC 220 is provided to the low-pass filter module 250, which uses the calibration voltage to cancel out the comparator offset error Vos 205. The low-pass filter module additionally attenuates quantization noise of the DAC 220. It is to be appreciated that comparator calibration system 200 in FIG. 2 creates a dynamic negative feedback loop with a high-pass transfer function with respect to comparator input terminals, that attenuates the low frequency noise components attributed to comparator DC offset and flicker noise. The corner frequency of attenuation depends on the update rate of the loop as well as capacitor ratio $C_{AZ2}/C_{AZ1}$ in the low-pass filter 250. The update rate is associated with the bandwidth of low-frequency flicker (1/f) noise tracking. More specifically, increasing the update rate causes an increase in the tracking bandwidth of the low-frequency noise.

For most applications, it is desirable to keep the offset cancellation value stable. For example, keeping the ratio $C_{AZ2}/C_{AZ1}$ high (e.g., 100 or larger) can attenuate most of the dynamic errors contributed by the calibration loop and keep the feedback value very stable. On the other hand, the larger capacitive ratio causes a reduction in the tracking bandwidth of the comparator flicker noise. Hence in the proposed comparator calibration system there is a trade-off between flicker noise tracking bandwidth and DAC 220 quantization noise filtering. An optimal design can be achieved when the two noise sources contribute equally to the residual error. For example in a given implementation with 6-bit calibration DAC a capacitor ratio of $C_{AZ2}/C_{AZ1}=8$ achieves such a trade-off. Depending on the process technology used, in certain implementations $C_{AZ1}$ cannot be too small, and as a result $C_{AZ2}$ has to be large enough to keep the ratio high.

Figure 3:
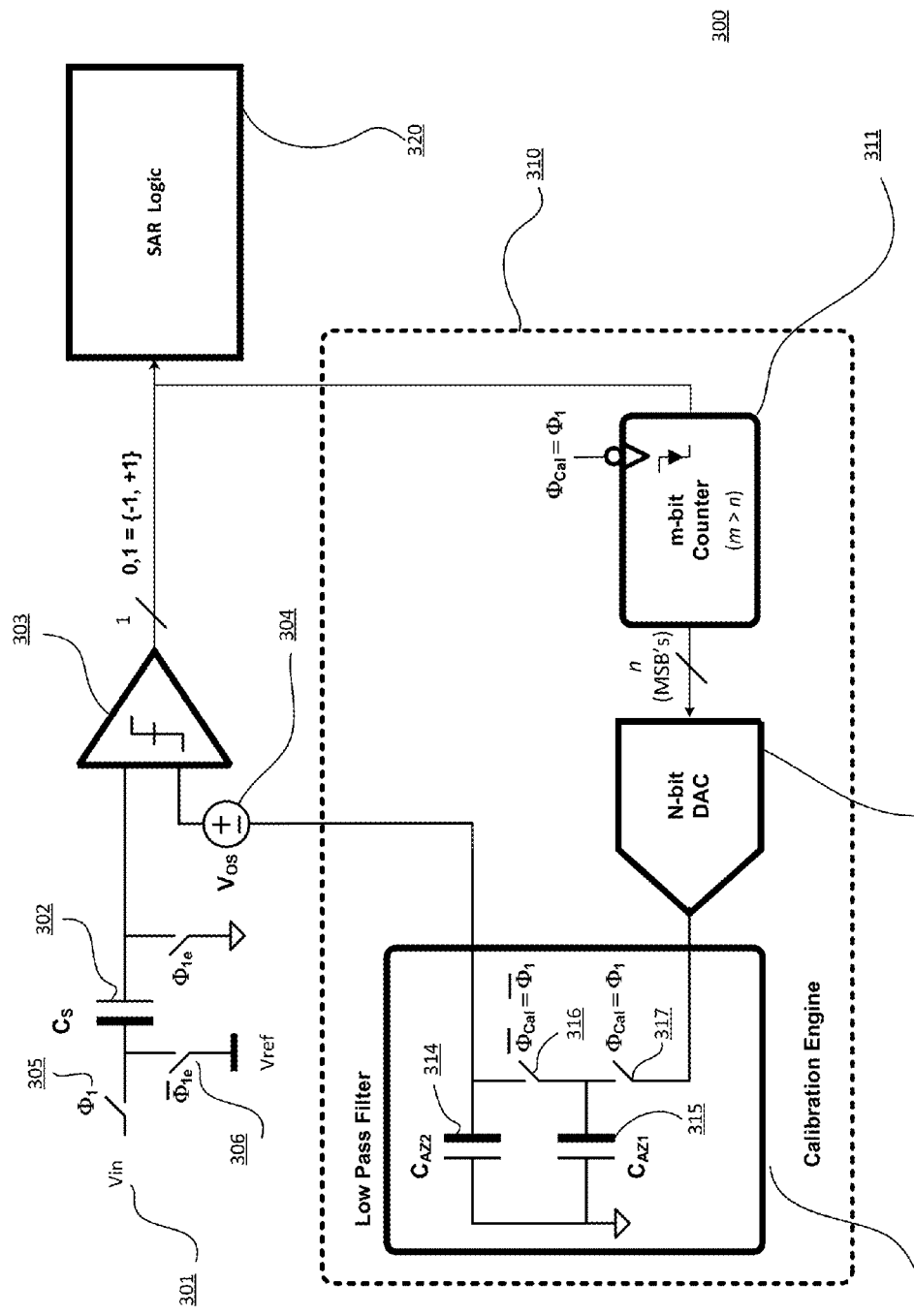
FIG. 3 is a simplified diagram illustrating a comparator calibration system according to an embodiment of the present invention.

FIG. 3 is a simplified diagram illustrating a comparator calibration system according to an embodiment of the invention. This diagram is merely an example, which should not unduly limit the scope of the claims. One of ordinary skill in the art would recognize many variations, alternatives, and modifications. For example, in the system 300 illustrated in FIG. 3 the low-pass filter 313 resembles the low-pass filter 250 in FIG. 2 and the up/down counter 311 resembles the digital integrator 210 in FIG. 2. In the system 300 shown in FIG. 3 the input signal is received at Vin 301, which is processed by the comparator 303 during the comparison phase when the sampling clock is "off" or Φ1=0. The inputs of the comparator 303 are coupled to the analog input Vin 301 through sampling capacitor 302 and coupled to the calibration feedback system 310 through voltage stored in hold capacitor $C_{AZ2}$ 314. The voltage source Vos 304 is used to model the equivalent input referred offset of the comparator 303. The calibration feedback system 310 includes the up/down counter 311 used as a digital integrator, a DAC 312, and a low-pass filter module 313 comprising the sampling capacitor $C_{AZ1}$ 315 and hold capacitor $C_{AZ2}$ 314.

Figure 4:
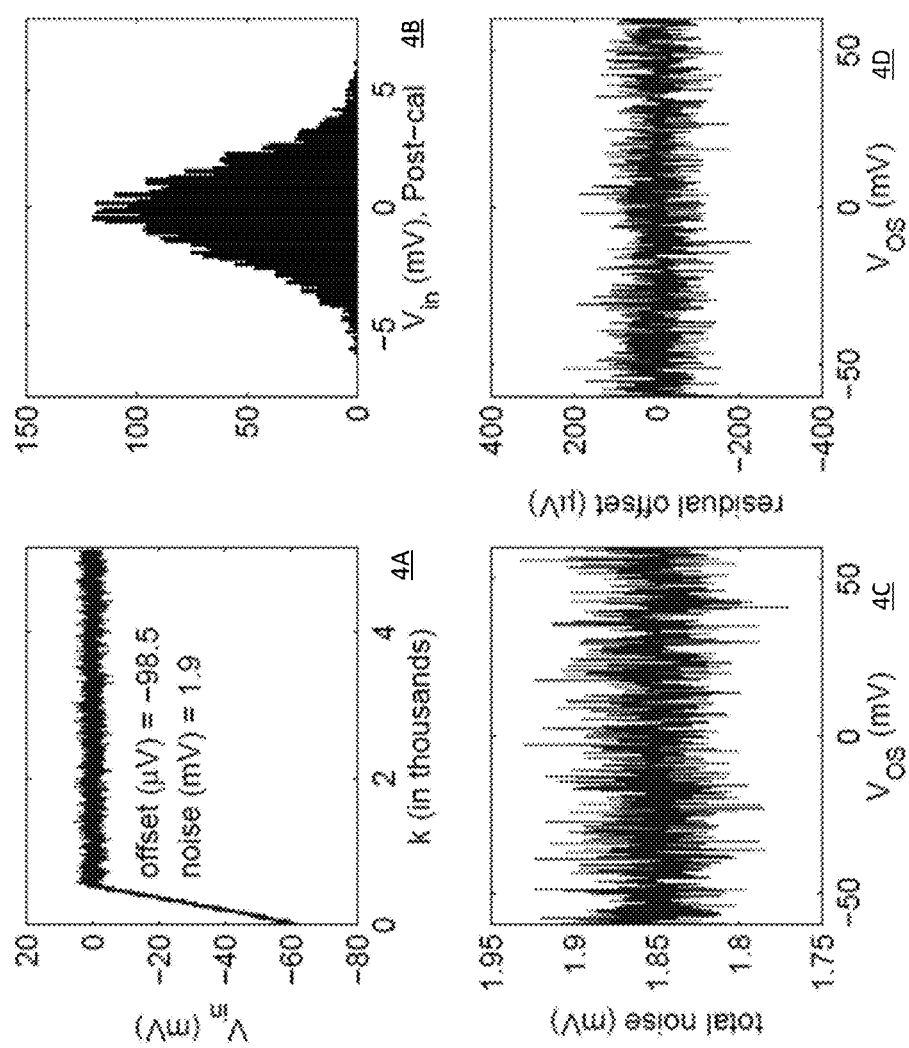
FIG. 4 provides graphs obtained by behavioral simulations that illustrate performance of the comparator calibration system 300 shown in FIG. 3.

FIG. 4 provides graphs obtained by behavioral simulations that illustrate performance of the comparator calibration system 300 shown in FIG. 3. The simulated system involves an offset calibration loop comprising a low resolution 6-bit DAC and a moderate resolution 10-bit counter. The counter is characterized by a shift factor of $2^{-4}$. As shown in graph 4D of FIG. 4, the simulated comparator offset range is ±60 mV, where the residual offset is reduced to ±200 (worst case) or attenuated by a factor of 300 in roughly 1000 cycles as shown in graph 4A of FIG. 4. The residual offset is approximately 40 times smaller than the LSB of the ADC. It is to be appreciated that this level of offset reduction is useful for a wide range of applications. As shown in graph 4A, a comparator calibration system operated over 4000 cycles, with an effective comparator input noise of about 1.9 mVrms. Initially, the comparator input offset was about −60 mV which is quickly corrected to about 0. The offset voltage was able to stabilize around −98.5 µV. The information is shown in graph 4B shows the histogram of comparator input voltage. More specifically, graph 4B shows a histogram of the voltage at the comparator input at each point in graph 4A after the calibration has converged (i.e., after 1000 cycles), where the standard deviation is 1.9 mV with a mean of −98 uV. The intrinsic noise of the comparator before calibration was 1.88 mVrms. The increase in noise from 1.88 mVrms to 1.9 mVrms after calibration is contributed by 280 µVrms dynamic noise from the calibration loop. Graph 4C shows the total RMS noise versus comparator offset Vos. As can be seen in graph 4C, the total noise can vary between 1.75 mV to 1.95 mV depending on the intrinsic (un-calibrated) offset of the comparator. Graph 4D shows the relationship between the residual (post calibration) offset and the intrinsic offset voltage Vos. As shown in graph 4D the residual offset also varies between −200 uV and 200 uV depending on the pre calibrated offset Vos.

As can be seen from FIG. 4, the embodiments of the present invention provide many performance advantages. In addition to reducing the amount of hardware components as explained above, various parameters for providing offset can be conveniently adjusted. For example, the range of correctable offset can be adjusted. Similarly, total noise, residual offset, and the number of cycles for converging is one of the characteristics that can be adjusted by changing one or more parameters. For example, to adjust these performance characteristics, counter shift value, counter resolution, DAC resolution, and capacitor values can be easily modified to suit the specific applications.

Figure 5:
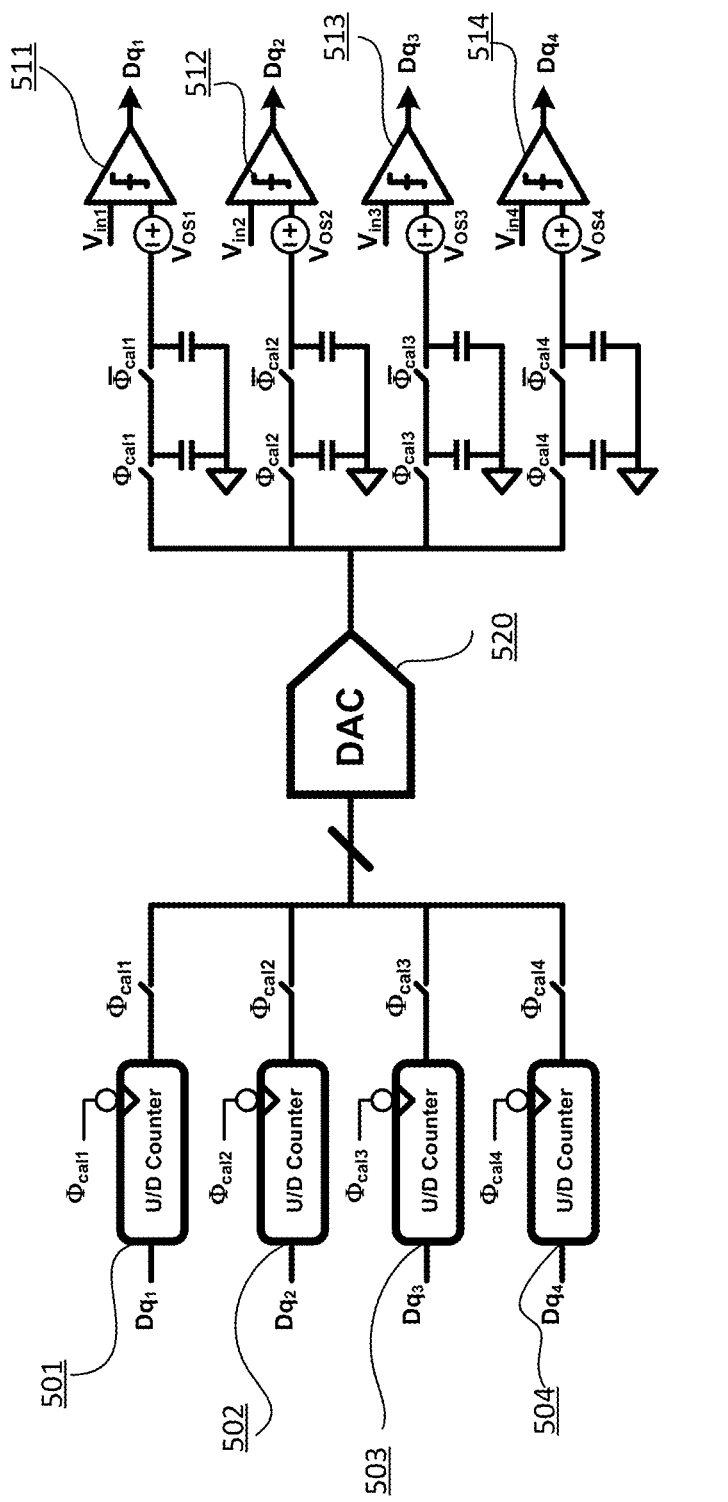
FIG. 5 illustrates a time-interleaved calibration system according to an embodiment of the present invention.

FIG. 5 illustrates a time-interleaved calibration system 500 according to an embodiment of the present invention. This diagram is merely an example, which should not unduly limit the scope of the claims. One of ordinary skill in the art would recognize many variations, alternatives, and modifications. As shown in FIG. 5, four comparators utilize a single DAC to perform a coarse estimate of each respective comparator offset. More specifically, comparators 511-514 utilize the DAC 520 and respectively use counters 501-504 for calibrating offset voltage. For example, the counter 501, the DAC 520, and the comparator 511 together form a comparator calibration feedback loop, similar to the system 200 shown in FIG. 2. Since the DAC 520 is not needed for calibrating the comparator 511 at the all times, comparators 512-514 use the DAC 520 at their respective pre-assigned time slots when the comparator 511 is utilizing the DAC 520 for calibration. In short, the DAC 520 is time-interleaved between the four comparators 511-514. It is to be appreciated that by interleaving the DAC 520, the number of hardware components is substantially reduced, which translates to lowered cost and size. As an example, there can be multiple comparators, each with its own counters and other components, to share the DAC for providing correction voltage.

Figure 6:
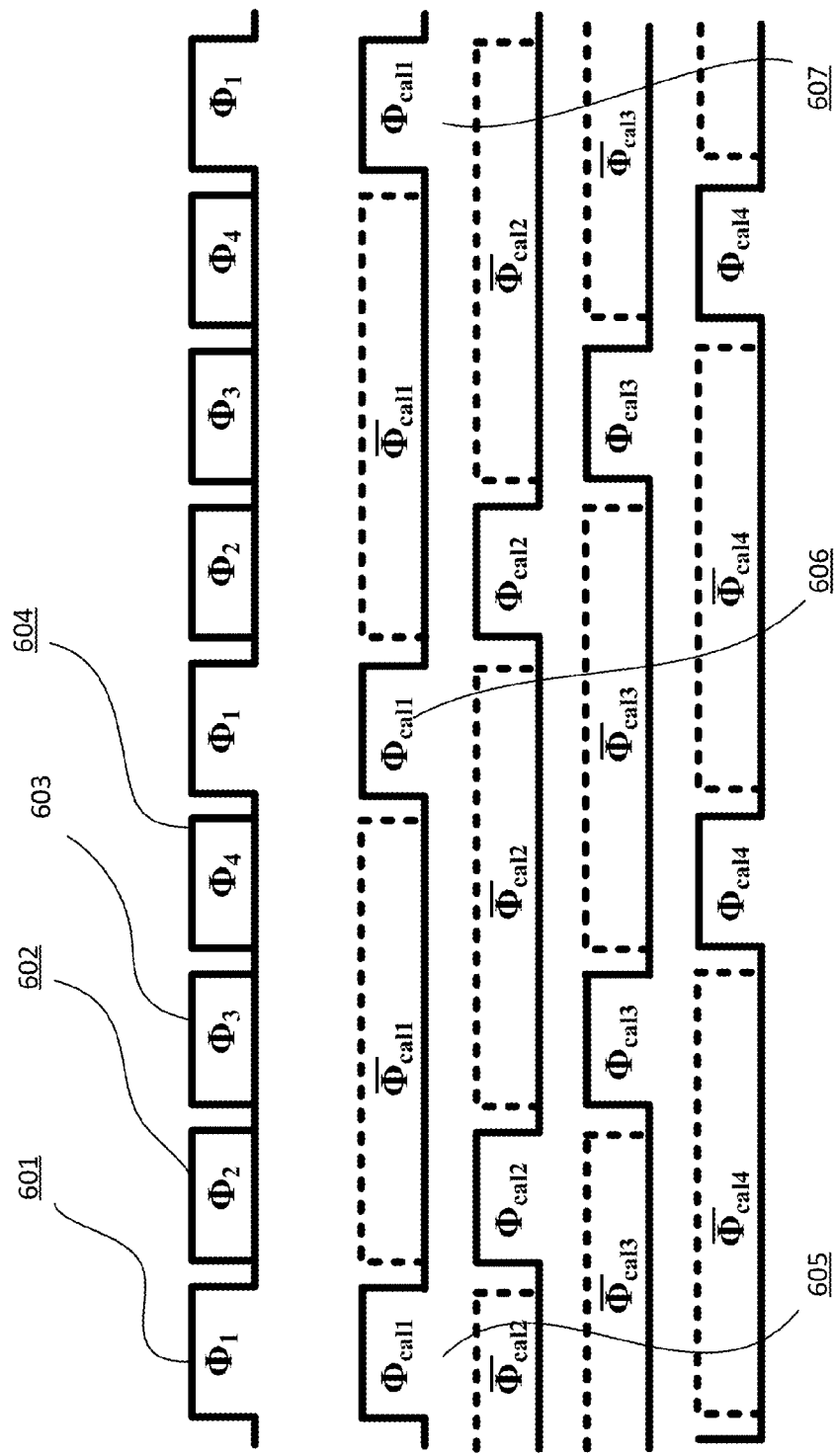
FIG. 6 is a simplified timing diagram illustrating operation of a comparator calibration system according to an embodiment of the present invention.

FIG. 6 is a simplified timing diagram illustrating operation of a comparator calibration system according to an embodiment of the present invention. This diagram is merely an example, which should not unduly limit the scope of the claims. One of ordinary skill in the art would recognize many variations, alternatives, and modifications. For example, $\Phi_1$ is associated with the calibration phase of the comparator system 501 shown in FIG. 5. More specifically when $\Phi_1$ is on at time 605, the output of the counter 501 in FIG. 5 is connected to the DAC 520, and at the same time the DAC output voltage is sampled to the low-pass filter associated with comparator 511. Similarly, when the $\Phi_2$ is on, the counter 502 gets connected to the DAC, and DAC output voltage gets sampled onto the low-pass filter associated with comparator 512. Since there are four comparator calibration systems, the $\Phi_1$ is not on until four phases later at time 606. For example, the four phases 601-604 respectively correspond to comparators 511-514 regarding the calibration thereof.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A data communication system, the system comprising:
   a data network;
   a voltage input;
   a low pass filter module electrically coupled to the voltage input and comprising a first capacitor and a second capacitor, the first capacitor and the second capacitor being configured in parallel, the first capacitor being characterized by a first capacitance value and the second capacitor being characterized by a second capacitance value, the first capacitance value being greater than or equal to the second capacitance value, the low pass filter being configured to provide an output voltage based at least on a first voltage of the first capacitor;
   a first calibration switch provided between the first capacitor and the second capacitor;
   a comparator electrically coupled to the low pass filter module and configured to generate a modification value, the modification value being positive if the output voltage is greater than 0, and the modification value being negative if the output voltage is 0 or less;
   a digital integrator electrically coupled to the comparator and storing an m-bits value, the m-bits value being updated using the modification value; and
   a DAC electrically coupled to the digital integrator, the DAC being configured to convert the n MSBs of the m-bits value to a feedback voltage, n being less than or equal to m.

2. The system of claim 1 wherein the feedback voltage is associated with an opposite polarity relative to a comparator intrinsic offset value.

3. The system of claim 1 wherein the first calibration switch is closed at a predetermined rate for providing a calibration voltage to the comparator.

4. The system of claim 1 wherein the m-bits value is a running sum based on the comparator output.

5. The system of claim 1 wherein the digital integrator is initialized with a midpoint value.

6. The system of claim 1 wherein the voltage input is associated with an intrinsic offset voltage of the comparator.

7. The system of claim 1 wherein:
   the modification value is +1 if the voltage input is greater than a difference between calibration voltage and comparator offset, and the modification value being negative if the voltage input is less than the difference between calibration voltage and comparator offset.

8. The system of claim 1 wherein the low-pass filter removes high frequency noises associated with the DAC.

9. A data communication system, the system comprising:
   a data network;
   a voltage input;
   a low pass filter module;
   a comparator electrically coupled to the low-pass filter module and configured to generate a modification value, the modification value being positive if an output voltage is greater than 0, and the modification value being negative if the output voltage is 0 or less;
   an up/down counter electrically coupled to the comparator and storing an m-bit value, the m-bit value being updated using the modification value;
   a DAC electrically coupled to the counter, the DAC being characterized by a noise tracking bandwidth, the DAC being configured to convert the n MSBs of the m-bit value to a feedback voltage, n being less than or equal to m; and
   the low-pass filter module configured to filter the feedback voltage to generate the output voltage, the low-pass filter module comprising a first capacitor and a second capacitor, the first capacitor being configured to removing noise associated with quantization errors associated with the feedback DAC.

10. The system of claim 9 wherein the m-bits value is a running-sum that is associated with a comparator intrinsic offset and its low-frequency noise.

11. A method in a data communication system, the method comprising:
   in a first comparator feedback loop, the first comparator feedback loop comprising a first comparator, a first counter, a DAC, and a first low-pass filter; and
   in a second comparator feedback loop, the second comparator feedback loop comprising a second comparator, a second counter, the DAC, and a second low-pass filter;
   during a first time period, generating, using the first comparator, a first modification value, the first counter generates a first calibration value, the DAC generates a first calibration voltage, the first low-pass filter filters the first calibration voltage;
   during the second time period, calibrating, using the first comparator, and using the filtered first calibration voltage, the second comparator generates a second modification value, the second counter generates a second calibration value, the DAC generates a second calibration voltage, the second low-pass filter filters the second calibration voltage.

12. The method of claim 11 further comprising a third comparator feedback loop and a fourth comparator feedback loop.

13. The method of claim 11 further comprising an SAR, the SAR being configured to use outputs of the first comparator and the second comparator to perform ADC operations.

14. The method of claim 11 further comprising a first input voltage and a second input voltage, the first comparator being configured to process the first input voltage, and the second comparator being configured to process the second input voltage.

15. The method of claim 11 wherein:
   the system operates at a frequency Fs;
   the system comprises n comparator feedback loops, the n comparator feedback loops including the first comparator feedback loop and the second comparator feedback loop, each of the comparators of the n comparator feedback loops being calibrated at a frequency lower than or equal to Fs/n.

16. The method of claim 11 wherein the first low-pass filter filters a low frequency noise partially generated by the DAC.

17. The method of claim 11 wherein:
the first counter accumulates an m-bits value;
the DAC converts n MSBs of the m-bits value, n being less than or equal m.

18. The method of claim 17 wherein the DAC is shared among n feedback loops and operates at the aggregate frequency of Fs.

* * * * *